United States Patent
Vladan et al.

(10) Patent No.: US 9,634,494 B2
(45) Date of Patent: Apr. 25, 2017

(54) POWER AMPLIFIER FOR WIRELESS POWER TRANSMISSION

(71) Applicant: Broadcom Corporation, Irvine, CA (US)

(72) Inventors: Ionel Marius Vladan, Oudenaarde (BE); Stefan Gaston P. Van Roeyen, Sint-Niklaas (BE); Jean-Francois Koleck, Gavere (BE)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 295 days.

(21) Appl. No.: 14/319,357

(22) Filed: Jun. 30, 2014

(65) Prior Publication Data

US 2015/0280443 A1    Oct. 1, 2015

Related U.S. Application Data

(60) Provisional application No. 61/970,147, filed on Mar. 25, 2014.

(51) Int. Cl.
*H01F 27/42* (2006.01)
*H01F 38/00* (2006.01)
(Continued)

(52) U.S. Cl.
CPC .......... *H02J 5/005* (2013.01); *H02J 7/0027* (2013.01); *H02J 7/025* (2013.01); *H02J 50/10* (2016.02); *H02J 50/40* (2016.02); *H03F 1/0294* (2013.01); *H03F 3/2171* (2013.01); *H03F 3/2173* (2013.01); *H03F 3/245* (2013.01); *H02J 7/345* (2013.01)

(58) Field of Classification Search
CPC .. H02J 5/005; H02J 7/025; H02J 17/00; H02J 50/12; H02J 50/10; H02J 50/90; H02J 50/60; H02J 50/80; H02J 7/00; H02J 7/0042
USPC ........................................................ 307/104
See application file for complete search history.

(56) References Cited

U.S. PATENT DOCUMENTS 5,781,056 A * 7/1998 Fujii ...................... H03K 5/135
                                                                327/233
6,963,624 B1 * 11/2005 He ......................... H03D 7/163
                                                                375/316

(Continued)

FOREIGN PATENT DOCUMENTS

WO    WO 2013/019819 A2    2/2013
WO    WO-2014/035260 A1    3/2014

OTHER PUBLICATIONS

European Search Report, App. No. 15000759.9, Aug. 6, 2015, 5 pages.

(Continued)

*Primary Examiner* — Jared Fureman
*Assistant Examiner* — Esayas Yeshaw
(74) *Attorney, Agent, or Firm* — Foley & Lardner LLP

(57) ABSTRACT

A power signal source may provide current to a transmit coil to support wireless power transmission. The power signal source may include one or more modulators in parallel that may be phase delayed by an angle with respect to one another. The phase delay angle allows for adjustment of the magnitude of the current. The current provided to the transmit coil may be independent of the load of the transmit coil.

20 Claims, 14 Drawing Sheets

(51) Int. Cl.
*H02J 5/00* (2016.01)
*H03F 1/02* (2006.01)
*H03F 3/217* (2006.01)
*H03F 3/24* (2006.01)
*H02J 7/00* (2006.01)
*H02J 7/02* (2016.01)
*H02J 50/10* (2016.01)
*H02J 50/40* (2016.01)
*H02J 7/34* (2006.01)

(56) References Cited

U.S. PATENT DOCUMENTS

| | | | | |
|---|---|---|---|---|
| 9,048,787 | B2* | 6/2015 | Jones | H03F 1/0227 |
| 9,077,405 | B2* | 7/2015 | Jones | |
| 9,136,914 | B2* | 9/2015 | Von Novak | G06K 7/0008 |
| 9,325,284 | B2* | 4/2016 | Wilson | H03F 1/0277 |
| 2006/0262013 | A1* | 11/2006 | Shiroma | H01Q 3/2647 |
| | | | | 342/370 |
| 2008/0118000 | A1* | 5/2008 | Kraut | H03C 5/00 |
| | | | | 375/297 |
| 2010/0244949 | A1 | 9/2010 | Gustavsson et al. | |
| 2011/0196544 | A1* | 8/2011 | Baarman | H01F 38/14 |
| | | | | 700/291 |
| 2011/0199046 | A1 | 8/2011 | Tsai et al. | |
| 2011/0273236 | A1 | 11/2011 | Heijden et al. | |
| 2012/0280794 | A1* | 11/2012 | Parrault | H04L 25/4906 |
| | | | | 340/10.1 |
| 2013/0082536 | A1 | 4/2013 | Taylor et al. | |
| 2013/0207482 | A1 | 8/2013 | Madawala et al. | |
| 2015/0162828 | A1* | 6/2015 | Sandner | H02M 3/158 |
| | | | | 323/271 |

OTHER PUBLICATIONS

Chen, T., et al., A Sub-mW All-Digital Signal Component Separator With Branch Mismatch Compensation for OFDM LINC Transmitters, Nov. 1, 2011, pp. 2514-2523, vol. 46, No. 11, IEEE Journal of Solid-State Circuits, Piscataway, New Jersey.

Ravi, A., et al., A 2.4-GHz 20-40-MHz Channel WLAN Digital Outphasing Transmitter Utilizing a Delay-Based Wideband Phase Modulator in 32-nm CMOS, Dec. 1, 2012, pp. 3184-3196, vol. 47, No. 12, IEEE Journal of Solid-State Circuits, Piscataway, New Jersey.

Xu, H., et al., A Flip-Chip-Packaged 25.3 dBm Class-D Outphasing Power Amplifier in 32 nm CMOS for WLAN Application, Jul. 1, 2011, pp. 1596-1605, vol. 46, No. 7, IEEE Journal of Solid-State Circuits, Piscataway, New Jersey.

Chen, T., et al., A Lower Power All-Digital Signal Component Separator for Uneven Multi-Level LINC Systems, Sep. 12, 2011, pp. 403-406, 2011 Proceedings of the IEEE, Taiwan, R.O.C.

Tsai, P., et al., A QPSK/16-QAM OFDM-based 29.1 Mbps LINC Transmitter for Body Channel Communication, Nov. 12, 2012, pp. 345-348, 2012 IEEE Asian Solid State Circuits Conference, Kobe, Japan.

Moloudi, S., et al., An Outphasing Power Amplifier for a Software-Defined Radio Transmitter, Feb. 3, 2008, pp. 568-636, 2008 Solid-State Circuits Conference, Digest of Technical Papers, IEEE International, Piscataway, New Jersey.

European Search Report, App. No. 15 000 759.9-1568, dated Dec. 6, 2016, pp. 1-8.

* cited by examiner

POWER AMPLIFIER FOR WIRELESS POWER TRANSMISSION

CROSS REFERENCE TO RELATED APPLICATIONS

This application claims priority to provisional application Ser. No. 61/970,147, filed Mar. 25, 2014, which is incorporated by reference in its entirety.

TECHNICAL FIELD

This disclosure relates wireless power transmission. This disclosure also relates to an antenna load independent current source for power signal generation.

BACKGROUND

Rapid advances in electronics and communication technologies, driven by immense customer demand, have resulted in the widespread adoption of mobile communication devices. Many of these devices, e.g., smartphones, have sophisticated processing capability and rely on clocks of different frequencies to perform different processing tasks, e.g., decoding and playback of encoded audio files. These devices may rely on portable power sources that are periodically charged. The ease and speed of the charging process may contribute to the commercial success of the device.

DETAILED DESCRIPTION

Figure 1:
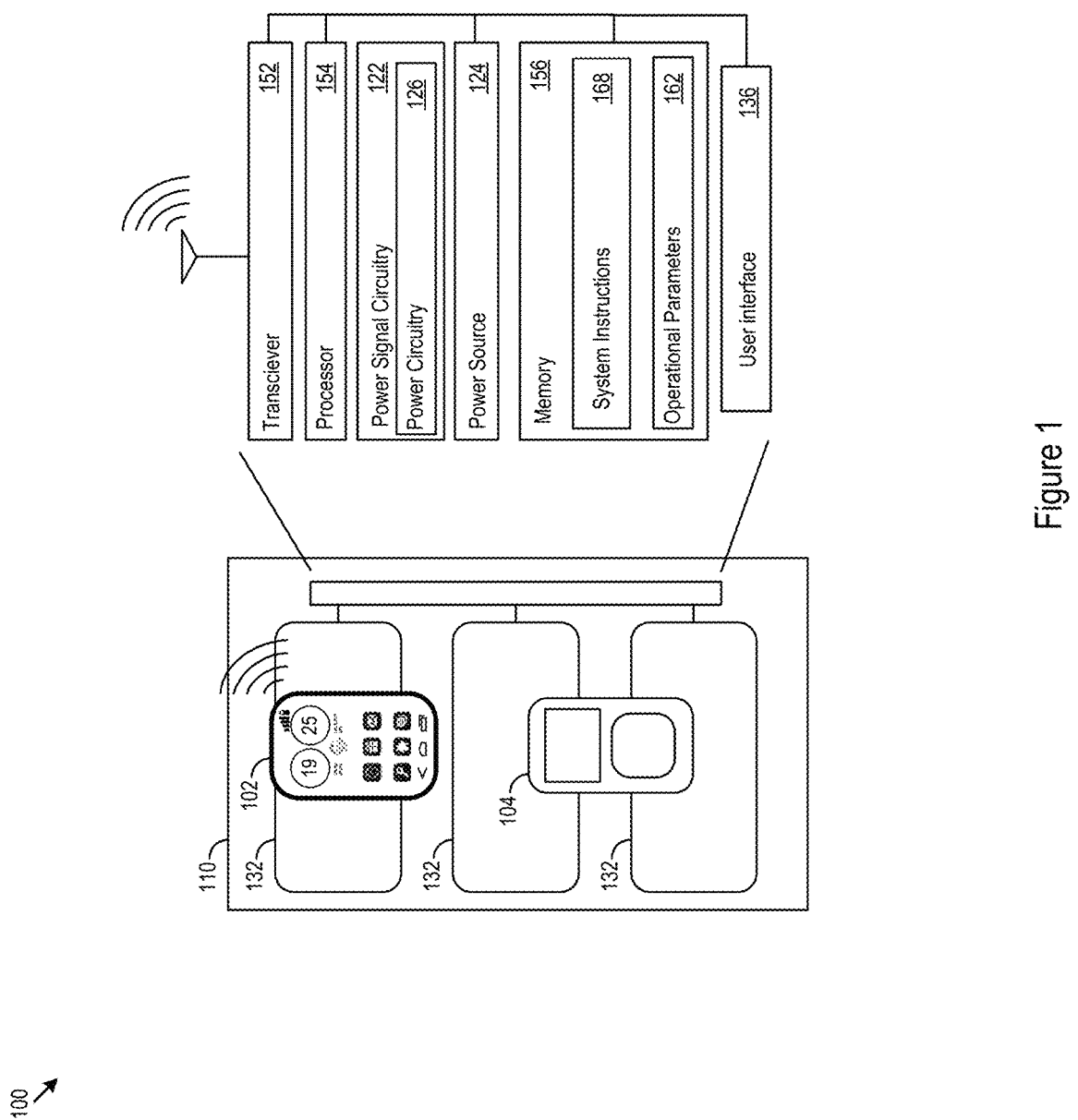
FIG. 1 shows an example wireless power environment.

FIG. 1 shows an example wireless power environment 100. The wireless power environment 100 includes a number of portable devices 102, 104 and a charging station (CS) 110 in this example, but the wireless power environment may include any device. The techniques described below regarding wireless power may be implemented in virtually any wireless power scenario. For example, the devices 102 receiving the wireless power may charge a battery, capacitor, or other energy storage subsystem. Additionally or alternatively, the devices 102, 104 may operate directly on the power received from the CS 110.

The CS 110 may include power signal circuitry (PSC) 122 to supply a power signal to a transmit coil 132 able to transmit the power signals to the portable devices 102. The CS 110 may include a power source 124 to support generation of the transmitted power signal. The PSC 122 may convert a source signal from the power source 124 into a form that the antenna may transmit. For example, the power source may provide a direct current (DC) or alternating current (AC) signal. The PSC 122 may include power circuitry 126 which may tune the basic signal from the power source to a particular frequency or signal level for transmission over the transmit coil 132 to the devices 102.

In various implementations, the CS 110 may include a transceiver 152 to support RF communication, one or more processors 154 to support execution of instructions, e.g., in the form of applications, and carry out general operation of the device. The CS 110 may include memory 156 for execution support and storage of system instructions 168 and operation parameters 162. In some implementations, the transceiver elements may receive status and/or control signals from the portable devices 102. In some implementations, the control and/or status signals may be used by the CS 110 to adjust power signal parameters and/or other wireless power provisional strategies. For example, the signals may allow for detection of new devices within the power signal range, determination of when a device in range has completed charging, and/or other status or control determinations. For example, a device 102 may in communication with the CS 110 over a wireless protocol, e.g. Bluetooth, Wi-Fi or other wireless protocol via transceiver 152. Additionally or alternatively, the CS may monitor internal parameters for status determination. For example, the load of 132 may be monitored to determine the presence/absence of devices within power signal range. For example, monitoring of internal parameters may be used to support charging of a device 104 which may not be in data communication with the CS 110. The communication device may include a user interface 136 to allow for user operation of the device.

For wireless power transmission, current may be supplied to a transmit coil. In some cases, the current supplied to the transmit coil may depend on the load of the transmit coil. For example, the current in a class D power transmission circuit may be expressed as:

$$\frac{2 \cdot VDC}{\pi} \cdot \frac{1}{|Zload|} \qquad \text{Equation 1}$$

Where Zload is the impedance of the transmit coil and VDC is a voltage supplied by a voltage source.

In some cases, the current level in the transmit coil may be controlled by varying VDC. For example, the voltage source may be a buck-boost converter, with a constant DC power supply. The buck-boost converter may allow the adjustment of the current over a range. For example, this range may vary from 0-40V for class E power transmission circuits and vary from 0-80V for class D power transmission circuits. These example voltages may be supplied for systems operating at 1 A (root-mean-squared, rms) and for a load impedance of up to 36Ω.

In some implementations, the value of Zload may vary over time. For example, when receiving antennas or other objects move in to or out of proximity of the transmit coil, the load of the transmit coil will vary. In some implementations, the voltage supplied by the voltage source may be adjusted to keep the peak current flowing in the transmit coil constant.

Figure 2:
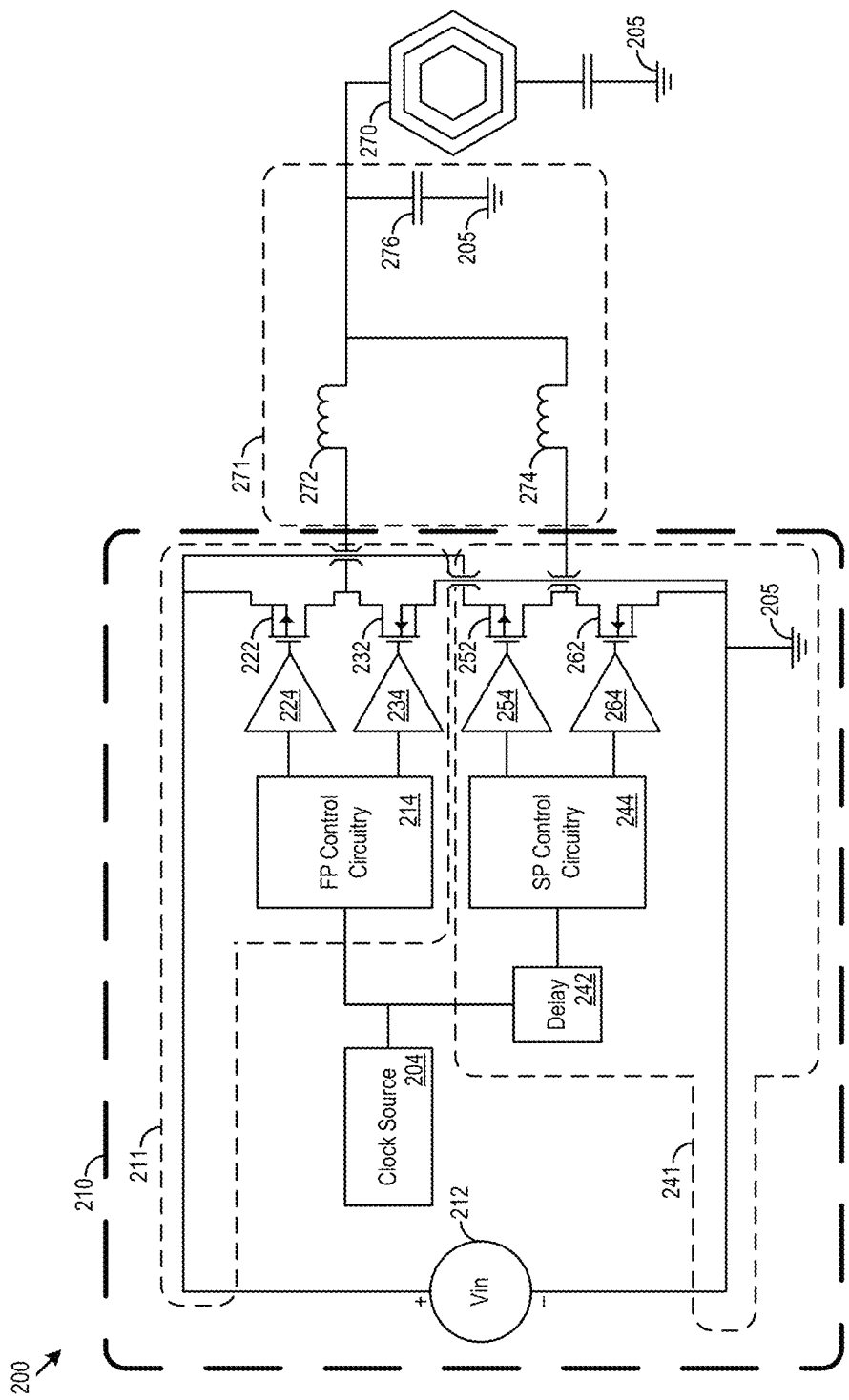
FIG. 2 shows example circuitry for wireless power transmission.

FIG. 2 shows example circuitry 200 for wireless power transmission, including a power signal source 210. In some implementations, the power signal source 210 may provide a sinusoidal, other oscillating waveform, or other time varying waveform, current to a transmit coil 270. The power signal source may use the output of a voltage source 212 as a base signal. In some implementations, the voltage source 212 may supply a DC voltage. The power signal source 210, which may include two paths 211, 241 having high-side and low side modulators 222, 232, 252, 262. The high-side modulators 222, 252 are tied to the high-side output of the voltage source 212. The low-side modulators 232, 262 may be coupled to the low side of the voltage source and reference level 205, e.g. ground. In various implementations, the high-side and low side modulators 222, 232, 252, 262 may may be positive metal-oxide semiconductor (pMOS) transistors or negative metal-oxide semiconductor (nMOS) transistors. Additionally or alternatively, bipolar junction transistors (BJT) may be implemented.

The two paths 211, 241 may receive a clock signal from the clock source 204. The clock signal may be passed along the first path (FP) 211 to the FP control circuitry 214. The FP control circuitry 214 may control FP drivers 224 and 234. For example, the FP control circuitry may control the amplification level of the drivers 224, 234 based on system conditions. In some cases, the amplification level may be set to achieve a determined on-off signal ratio for the FP modulators 222, 232. In some implementations, the FP control circuitry may supply operational voltages to the FP drivers to serve as a power source. The FP control circuitry 214 may pass the clock signal to the FP drivers 224, 234. The FP drivers 224, 234 may amplify the clock signal to drive the FP high-side 222 and low-side 232 modulators.

The FP modulators 222, 232 may produce an oscillating power signal by modulating the output of the voltage source 212. For example, the FP high-side 222 and low-side 232 modulators may cooperatively produce a 50% duty cycle square-wave signal through coordinated on-off switching.

The clock source 204 may also pass the clock signal along the second path (SP) 241. The SP may include a phase delay 242. The phase delay may shift the phase of the clock signal on the SP by an angle, Φ, with respect to the clock signal on the FP. The delayed clock signal is output coupled from the phase delay 242 to the SP control circuitry 244. The SP control circuitry 244 may control SP drivers 254, 264. The SP drivers 254, 264 may amplify the clock signal to drive the SP high-side 252 and low-side 262 modulators.

The SP modulators 252, 262 may produce an oscillating power signal by modulating the output of the voltage source 212. For example, the SP high-side 252 and low-side 262 modulators may cooperatively produce a 50% duty cycle square-wave signal through coordinated on-off switching. The oscillating signal produced by the SP modulators 252, 262 may be shifted with respect that produced by the FP modulators by the angle Φ. In some cases, the FP oscillating signal may be considered to have phase Φ/2 and the SP oscillating signal may be considered to have phase −Φ/2.

The output of the FP 222, 232 and SP 252, 262 modulators may be passed through a filter 271 including inductive 272, 274 and parallel or series capacitive 276 elements. The filter 271 may act as a LC filter and establish a center frequency, ω0, for the example circuitry 200. The output of the filter may be passed to the antenna coil. In some implementations ω0 may be expressed as:

$$\omega 0 = \frac{1}{\sqrt{Linv \cdot Cinv}} \qquad \text{Equation 2}$$

Where Linv is the inductance associated with the filter 271 and Cinv is the capacitance associated with the filter 271. In the filter 271, the two input branches from the FP and the SP are passed through inductors 272 and 274, which may have inductance values 2*Linv. In the example circuitry 200, the halves of the signal are exposed to 2*Linv before being combined. This may have a similar effect to passing the combined current through an inductor of value Linv.

In some implementations the circuitry 200 may act as a current source and the peak amplitude current (iload) may not be dependent on the load of the transmit coil 270. In some cases, combining the two signals from the FP and the SP may allow the iload to be controlled by adjusting the angle Φ. Adding two repeating signals where one signal constitutes a phase shift of the other results in a third signal of the same time with an amplitude that depends on the angle and a phase shift that depends on the angle. For example, iload may be expressed as:

$$iload = \frac{2 \cdot \omega 0 \cdot Cinv \cdot Vin}{\pi} \cos\left(\frac{\Phi}{2}\right) \qquad \text{Equation 3}$$

Where Vin is the voltage supplied by the voltage source 212.

Figure 3:
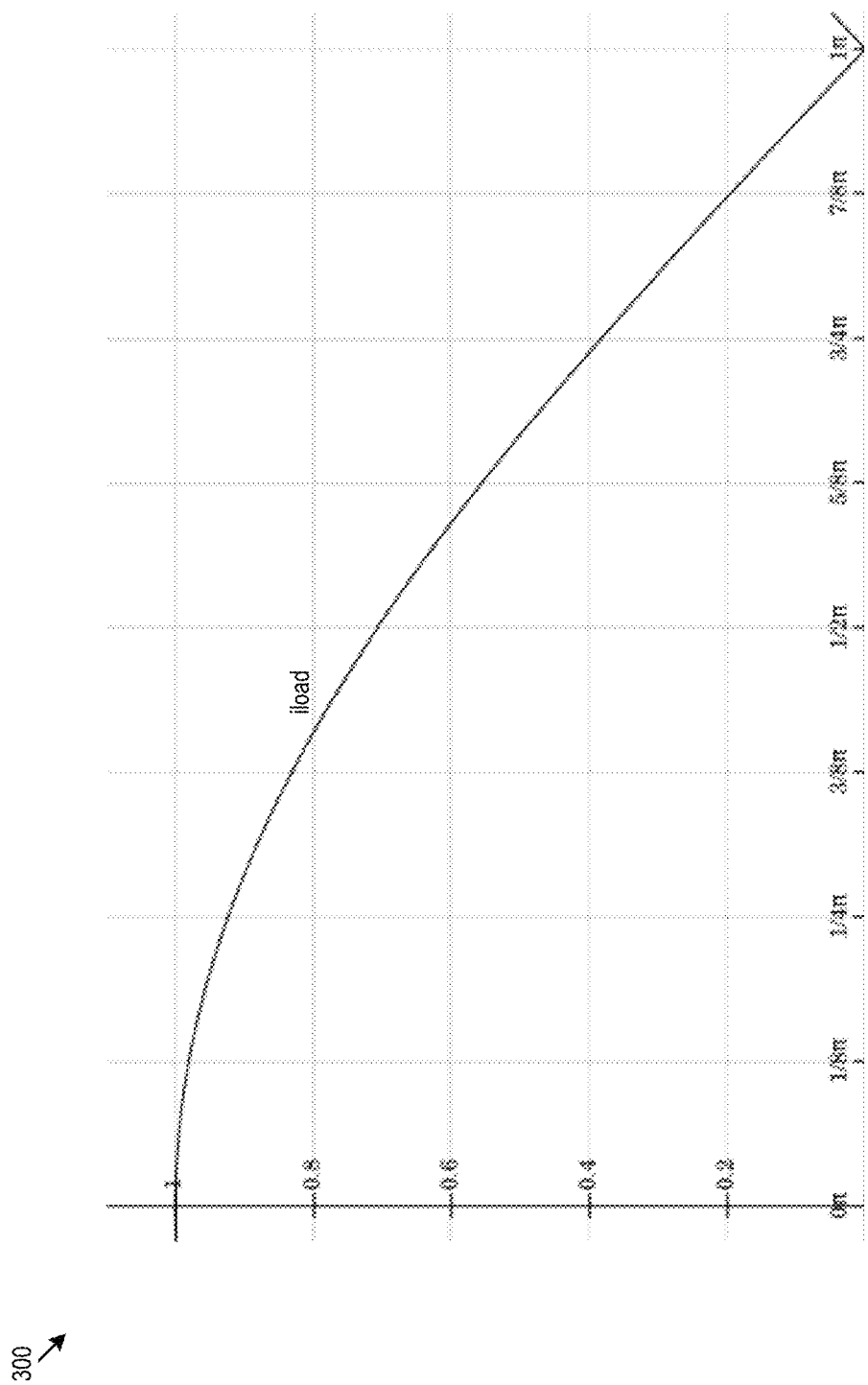
FIG. 3 shows an example plot of iload versus the angle Φ.

FIG. 3 shows an example plot 300 of iload versus the angle Φ. In the example plot 300, the value of iload is normalized using the largest value of iload to produce a unitless quantity versus the angle Φ. The largest value of iload may be controlled by setting the parameters of the circuitry 200. For example, Vin and/or Cinv may be adjusted to increase or decrease the range on which iload can be varied.

In some cases, phase based modulation may allow for high-speed current level changes within the transmit coil. High-frequency changes in the current may be achieved. In some implementations, the voltage level used in the circuitry 200 may be defined by the application of the circuitry 200. For example, the transmit coil load may not contribute to selection of the implemented voltage level. In some cases, a reduced voltage level range may allow for the use of more compact integrated or discrete components.

Figure 4:
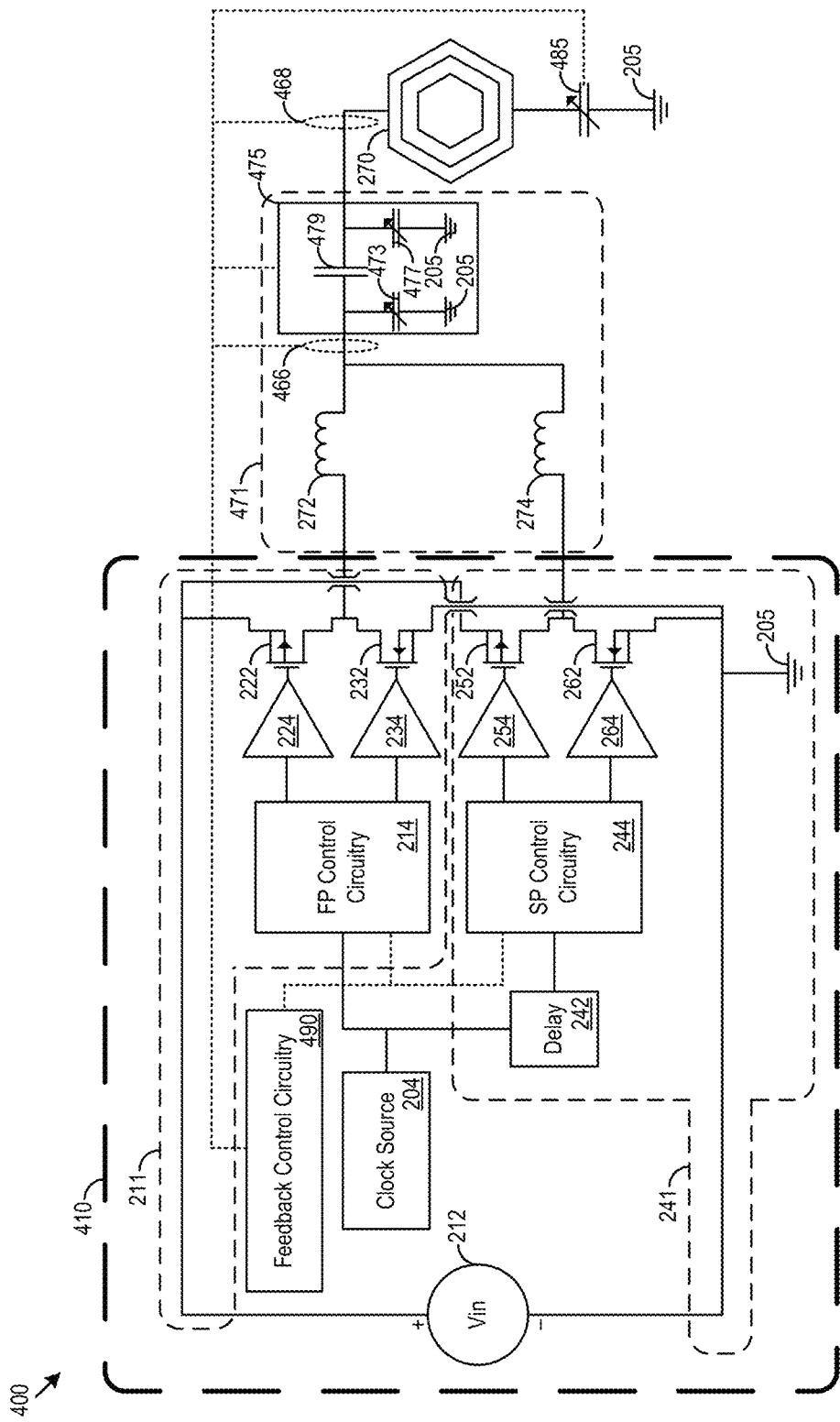
FIG. 4 shows example circuitry for wireless power transmission.

FIG. 4 shows example circuitry 400 for wireless power transmission. In some implementations, a matching network 475 may be included in the filter 471 between the power signal source 410. The power signal source 410 may operate similarly to the power signal source 210 of FIG. 2, but may further include feedback control circuitry 490. The feedback control circuitry 490 may be used to determine the phase angle Φ to set between the FP 211 and the SP 241. Additionally or alternatively, the feedback control circuitry 490 may be used to control the matching network 475. The matching network may include variable elements, such as variable capacitors, that may be adjusted. For example, the matching network may include variable parallel capacitors 473, 477, and series capacitor 479. The capacitors 473, 477, 479 may have capacitances C2, C3, and C1, respectively. The variable elements of the matching network 475 may be used to compensate of for the variation in components in the filter 471. Variations may include process, voltage, and temperature variations. The capacitor 485 may include a variable capacitance. The capacitor 485 may be used to compensate for the reactance of the antenna. The capacitor 485 may be a variable capacitor with capacitance Ccomp. In some implementations, the capacitor 485 may be controlled by the feedback control circuitry 490.

In an example implementation, the current ω0 and iload, the current being input into the coil, for the circuitry 400 may be expressed as:

$$\omega 0 = \frac{1}{\sqrt{Linv \cdot \left(C3 + \frac{C1 \cdot C2}{C1 + C2}\right)}} \quad \text{Equation 4}$$

$$iload = \omega 0 \cdot \left(C2 + C3 + \frac{C2 \cdot C3}{C1}\right) \cdot \frac{2}{\pi} \cdot Vin \cdot \cos\left(\frac{\Phi}{2}\right) \quad \text{Equation 5}$$

In various implementations, the feedback control circuitry 490 may operate sensors 466, 468 to measure current and/or other parameters at multiple locations on the circuitry 400. The feedback control circuitry 490 may use the parameter measurement to adjust the angle Φ between the phases of the signals on the paths of the power signal source 410. The feedback control circuitry 490 may also control the matching network 475 based on the measured parameters. Additionally or alternatively, the capacitor 485 may be controlled by the feedback control circuitry based on one or more of the measured parameters. In various implementations, the sensors 466, 468 may measure the phase of the current before and after the matching network 475. As discussed below, the multiple point phase measurement may allow for a low loss or lossless current measurement.

In various implementations, the transconductance of the system, Ysys, and the equivalent inverter capacitor, Cv, of the matching network may be expressed as two different functions of C1, C2, and C3. In some cases, by adjusting C2 and/or C3, Ysys may be modified while Cv is held constant. Additionally or alternatively, Cv may be modified while Ysys is held constant. In various implementations, Cv and Ysys may be expressed as:

$$Cv = C3 + \frac{C1 \cdot C2}{C1 + C2} \quad \text{Equation 6}$$

$$C2e = C2 + C3 + \frac{C2 \cdot C3}{C1} \Rightarrow Ysys = \frac{iLd}{Vin} = \frac{\pi}{2} j \cdot \omega 0 \cdot C2e \quad \text{Equation 7}$$

Where iload is the load current. Further, Iinv the current input into the matching network may be expressed as:

$$Iinv = iload \cdot \left(1 + \frac{C1}{C3} + j \cdot \omega 0 \cdot C2e\right) \quad \text{Equation 8}$$

$$\left(j \cdot \omega 0 \cdot Lcoil + RL + j \cdot XL + \frac{1}{j \cdot \omega 0 \cdot Ccomp}\right)\Bigg)$$

Where Lcoil is the inductance of the transmit coil, and j is the square root of −1. The expression RL+j*XL represents the reflected impedance from the power receiving unit.

Figure 5:
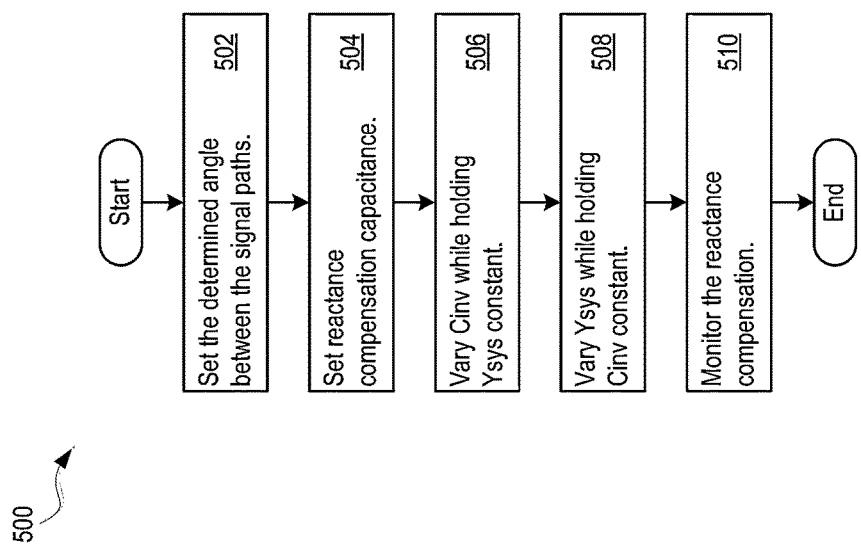
FIG. 5 shows example circuitry for reactance compensation.

FIG. 5 shows example logic 500 for reactance compensation. The logic 500 may start by setting a determined angle, Φ0, between the signal paths (502). The determined angle Φ0 may be a default starting value. In some cases, the angle may be selected based at least in part on safety concerns. For example, the angle may be selected to keep heating in the transmit coil below a certain level. The logic may set Ccomp such that the measured phase of the current before the matching network θinv and the phase of the current at the input of the coil θcl are 90 degrees apart (504). The logic 500 may vary Cinv while holding Ysys constant (506). The logic 500 may vary Ysys to locate the point where iload has the minimum derivative with respect to Ccomp.

The logic 500 may vary Ysys while holding Cinv constant (508). The logic 500 may vary Ysys to set the load current iload at a determined value. The determined value of iload may be determined by the application. For example, iLd may be selected based on the charging parameters of a device. The logic 500 may monitor the reactance compensation of the system (510). For example, the logic 500 may implement the logic 600 below to monitor the reactance compensation of the system.

Figure 6:
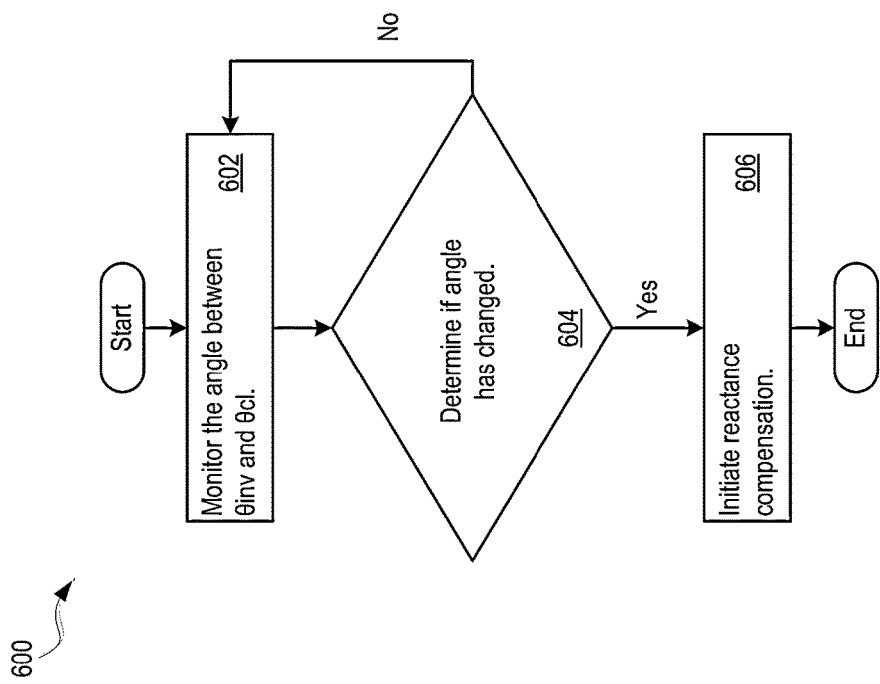
FIG. 6 shows example circuitry for reactance compensation monitoring.

FIG. 6 shows example logic 600 for reactance compensation monitoring. The logic 600 may monitor the angle between θinv and θcl (602). For example, the logic 600 may determine if the angle between θinv and θcl has drifted from a value of 90 degrees. The logic may determine if the angle between θinv and θcl has changed such that a compensation process may be initiated (604). For example, the logic 600 may determine if the angle between θinv and θcl differs from 90 degrees more than a determined threshold. Based on the determination, the circuit may initiate compensation (606) or continue monitoring the angle between θinv and θcl (602). For example, the logic 600 may implement the logic 500 to perform reactance compensation. In some implementations, the logic 600 may implement the logic 500 using the current angle between the two paths as the determined angle Φ0.

Lossless Current Sensing

In some implementations, a resistor may be placed in series with a transmit coil and a ground. The resistor may be used for a Rsensing current measurement. In some cases, Rsensing current measurements may be associated with losses within transmit coil system.

In some cases, the measurement of current within the transmit coil of a wireless power system may be accomplished using the sensors or other detectors used in a phase measurement. The phase measurement sensor may also be used to calibrate a matching network coupled to the transmit coil.

Figure 7:
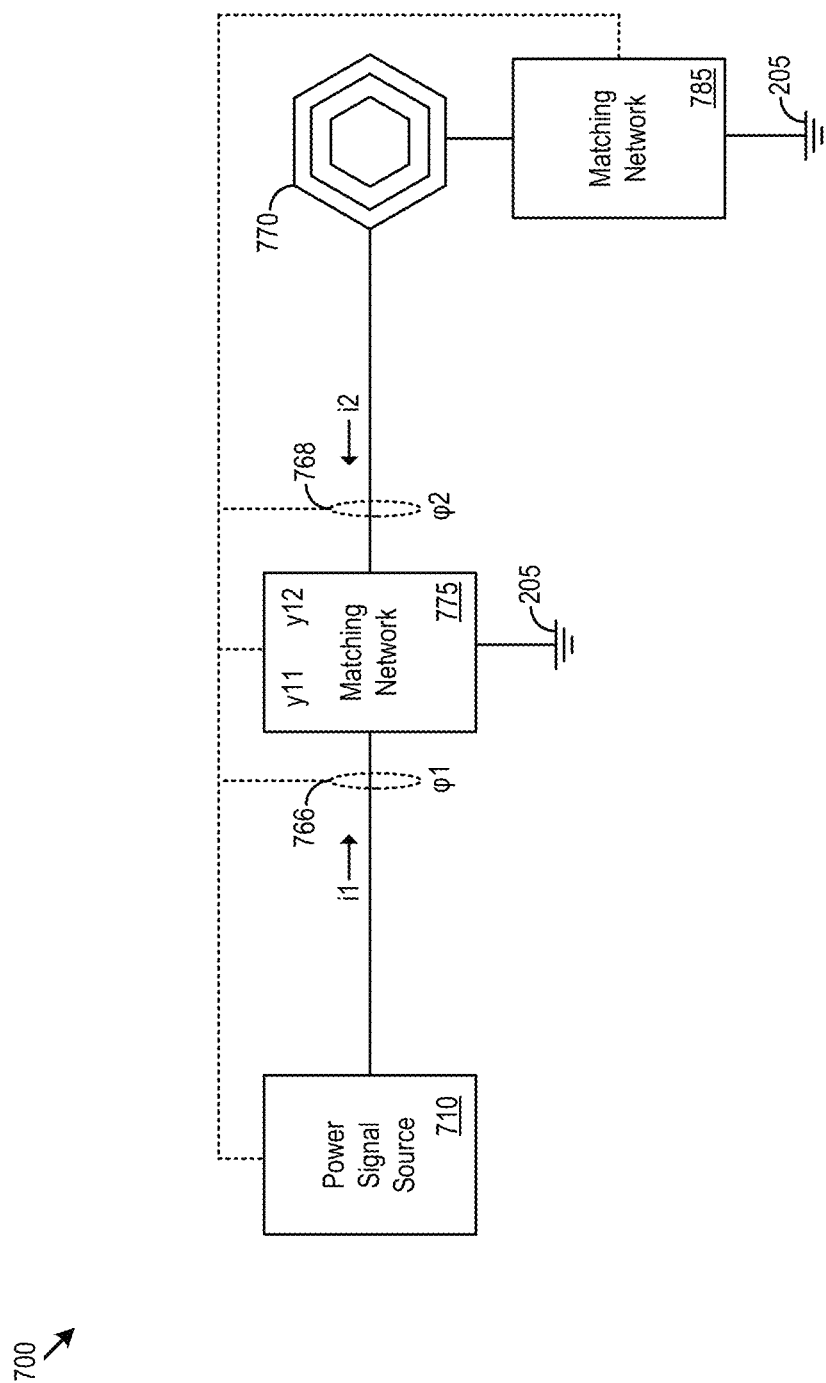
FIG. 7 shows example circuitry supporting phase-based current measurement.

FIG. 7 shows example circuitry 700 supporting phase-based current measurement. A power signal source 710 supplies a current signal to the input of a matching network 775. The output of the matching network is coupled to the transmit coil 770. Two phase sensors 766, 768 are placed at the input and output of the matching network. The current, i1, at the input of the matching network is controlled by the signal supply 710. The current at the output of the matching network, i2 may be expressed in terms of i1, the phase angle between the measurement points, φ21, phase of the current at the input to the matching network, φ1.

To calculate the relationship between i1 and i2, parameter angles between impedances y11 and y12 may be used. In various implementations, the relationship between the parameter angles and the currents may be expressed as:

$$i1 = (y11 + y12)\varphi 1 + i2,\qquad \text{Equation 9}$$

$$\text{where: } y11 = \frac{i1(\varphi 2 = 0)}{\varphi 1},$$

$$\text{and: } y12 = \frac{i1(\varphi 1 = 0)}{\varphi 2}.$$

Ccomp, the capacitance used to compensate for the reactance of the transmit coil 770, may be supplied by a second matching network 785. When the circuitry 700 is simplified such that Ccomp is brought into the matching network and resistive and Rsensing elements are removed, the impedances simplify into purely capacitive contributions. The angles between the parameters are then 90 degrees because they represent impedances that are purely imaginary. For the example circuitry 700, the relationship between currents i1 and i2 may be expressed as:

$$i2 = i1 \cdot \frac{\cos(\varphi 1)}{\sin(\varphi 1 - \varphi 21)} \qquad \text{Equation 10}$$

Figure 8:
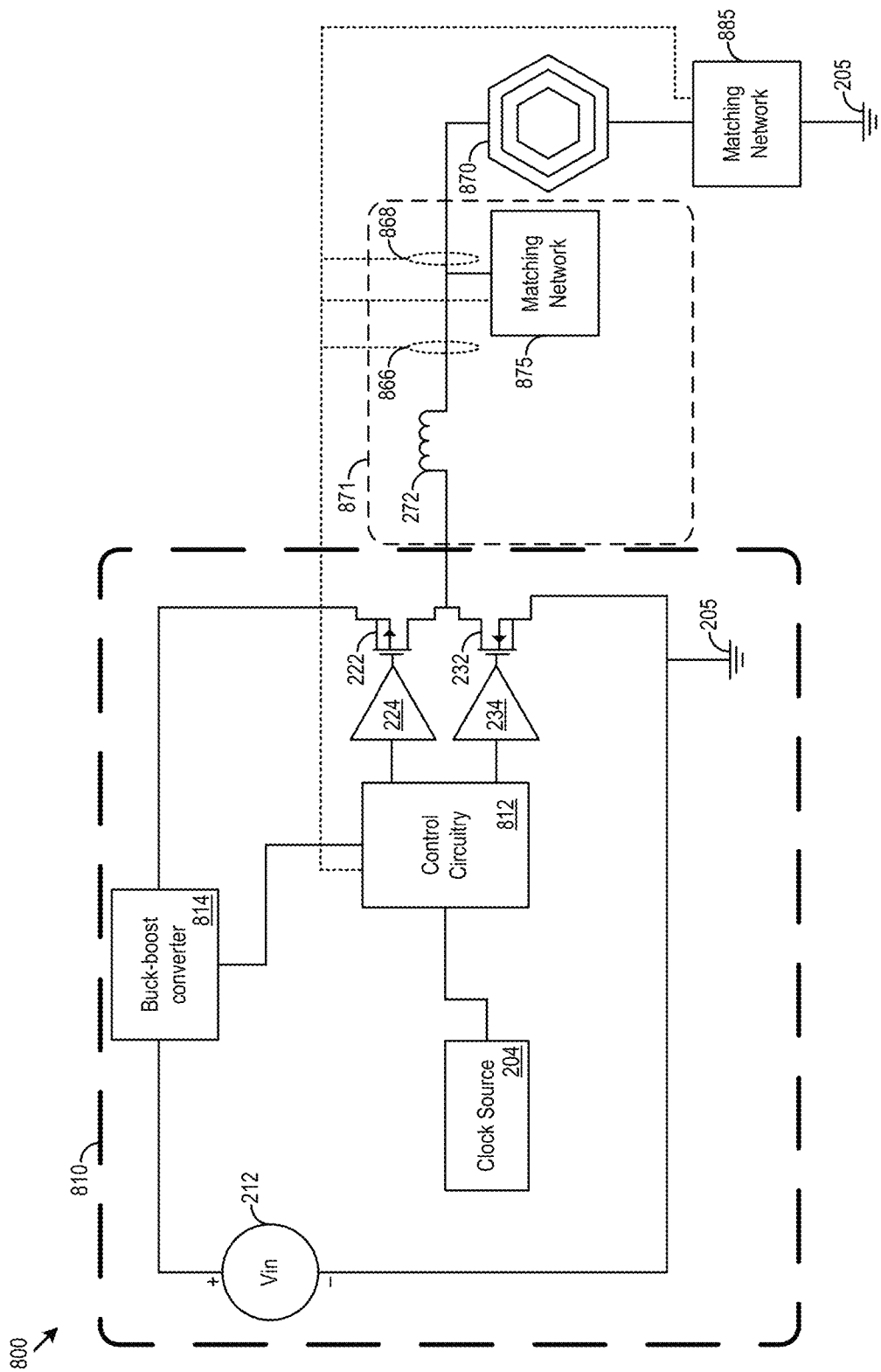
FIG. 8 shows example circuitry for wireless power transmission.

FIG. 8 shows example circuitry 800 for wireless power transmission. The circuitry 800 includes a class D power signal supply 810. Phase detectors 866, 868 may supply phase measurements of the current from the input to the matching network 875 and the output of the matching network 875. The phase detectors 866, 868 may provide the measurement of the phase to control circuitry 812. The control circuitry 812, may adjust the output the power signal supply 810 in response to the phase measurements. The matching network 875 may act as a component within a filter 871. The control circuitry 812 may adjust the buck-boost converter 814 to increase or decrease the power signal output of the circuitry 800. The control circuitry 812 may also adjust the voltage output of the converter 814 to compensate for changes in the transmit coil load. The control circuitry 812 may adjust the matching network 875 and the compensation matching network 885 to execute the phase based power measurement. Additionally or alternatively, the control circuitry 812 may adjust the matching network to compensate for the reactance of the transmit coil 870.

In various implementations, the example circuitry 400 may be used to implement the phase based current measurement using sensors 466 and 468. The phase-based current measurement may be implemented with virtually any wireless power transmission systems that use a matching network and a transmit coil.

Multi-Chip Power Synchronization

Figure 9:
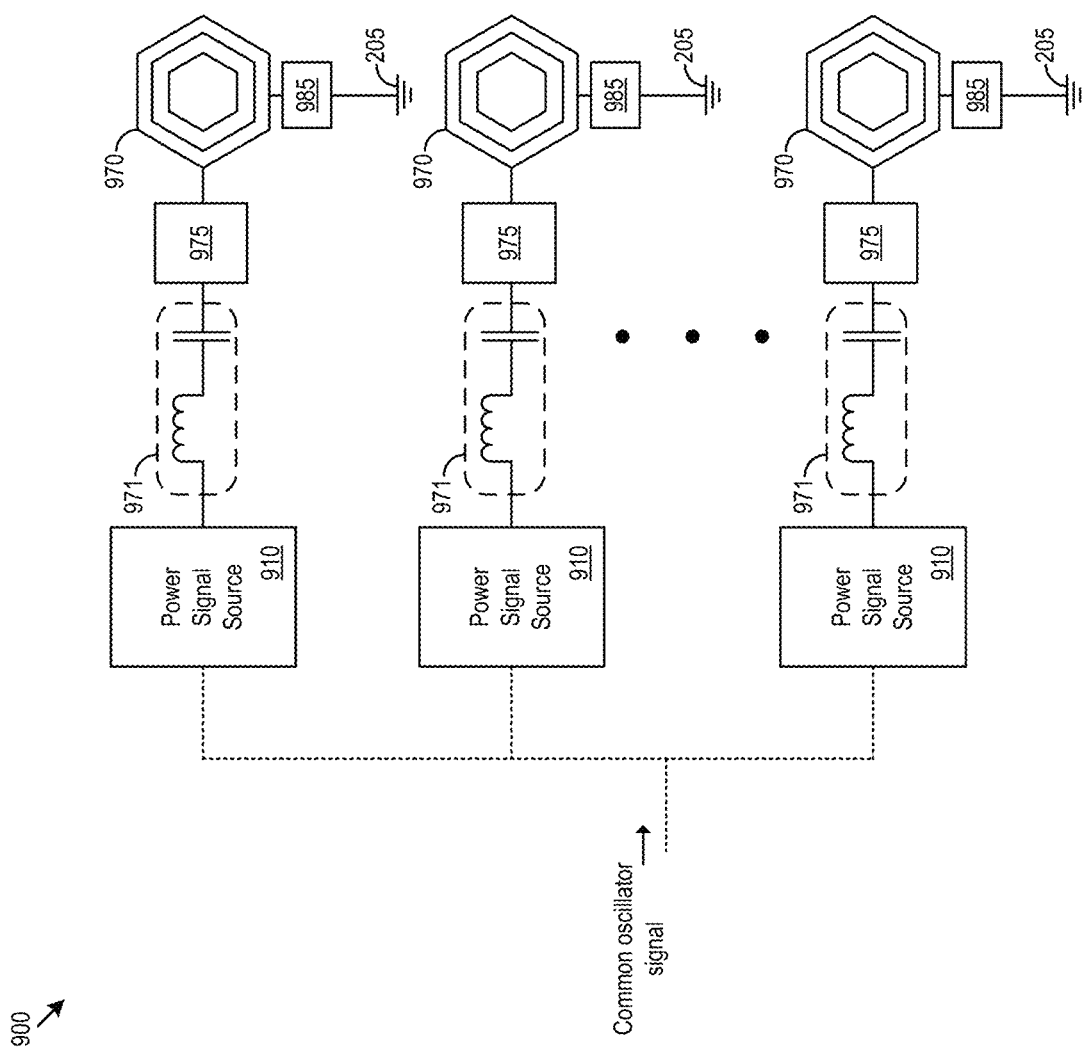
FIG. 9 shows example circuitry for wireless power transmission.

FIG. 9 shows example circuitry 900 for wireless power transmission. The example circuitry 900, comprises multiple power signal sources 910, such as power transmission units, and multiple transmit coils 970. The circuitry 900 may further include filters 971 and matching networks 975. The circuitry may also include compensation networks 985 to compensate for the reactances of the coils 970.

In various implementations, the power signal sources 910 may drive the multiple coils synchronously. The power signal sources 910 may use a common oscillator signal and may drive their respective coils at varying phases using the common oscillator signal to maintain a synchronous relationship. The phases of the power signal sources may be selected based on the application of the circuitry 900. For example, the phase relationships may be selected to maximize power transmitted. In another example, the phase relationships may be selected to shape the field generated by the power signal sources. In some cases, the receiving coil of a charging device may not be parallel to the transmit coils 970. The phases may be selected to attempt to align the field for optimal transmission to the receiving coil. In another example, one or more of the power signal source 910 may be deactivated while one or more other power signal sources 910 continue transmitting to control the shape and/or power output of the circuitry 900. In some implementations, the phase relationships of the power signal source 910 may be fixed based on fixed delays within the circuitry 900. In other implementations, the phase relationships between the power signal sources 910 may not be fixed. For example, the phase relationships may be dynamically adjusted using control circuitry.

Figure 10:
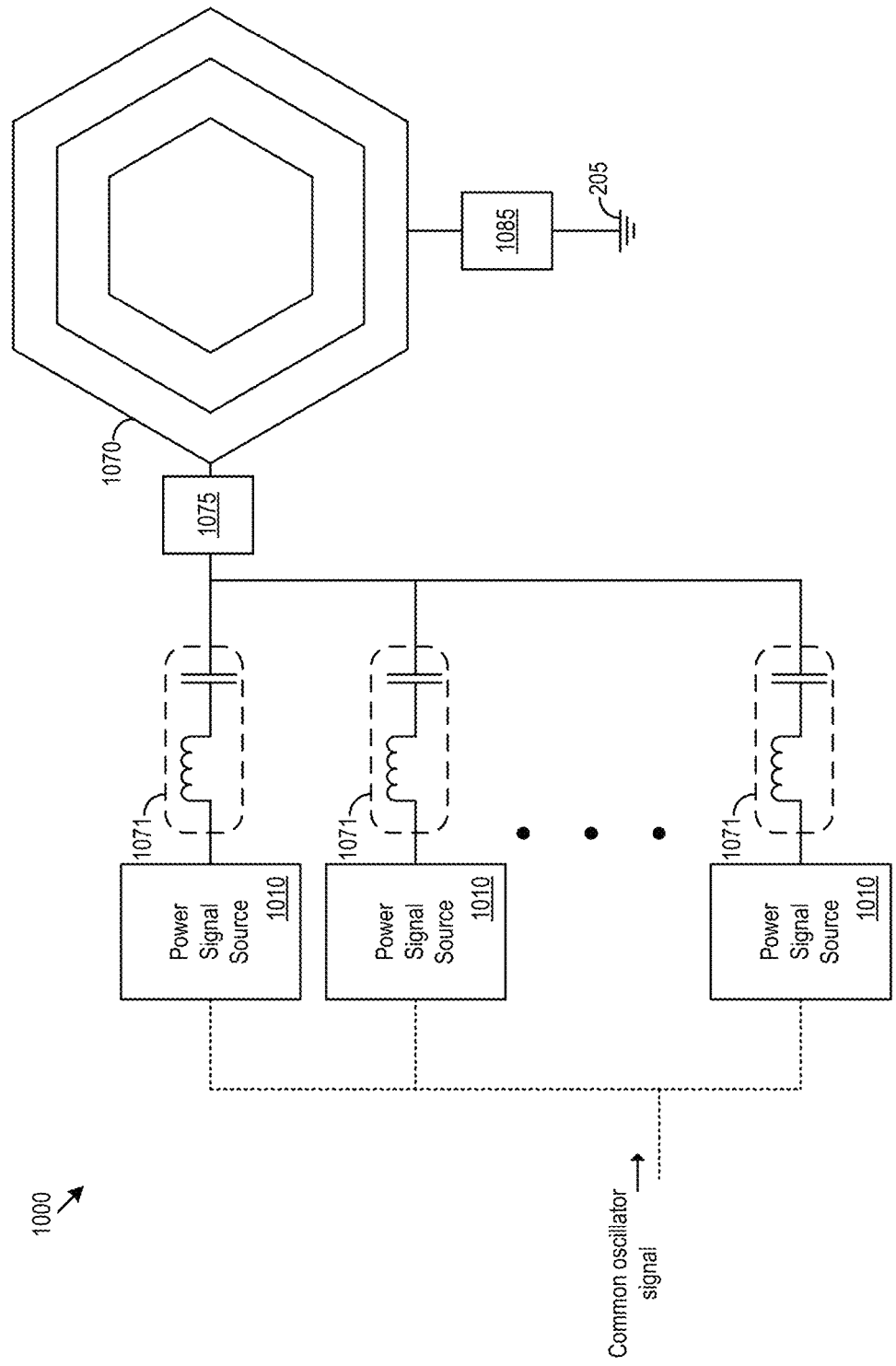
FIG. 10 shows example circuitry for wireless power transmission.

FIG. 10 shows example circuitry 1000 for wireless power transmission. The example circuitry 1000, comprises multiple power signal sources 1010, such as power transmission units, and a single coil 1070. The circuitry 1000 may further include filters 1071 and a matching network 1075. The circuitry may also include a compensation network 1085 to compensate for the reactance of the coil 1070.

In various implementations, the power signal sources 1010 may drive the coil 1070 synchronously. Similar to the circuitry 900 above, the phase relationships of the power signal source 1010 in the circuitry 1000 may be determined based on the application of the circuitry 1000.

The use of multiple coils and/or multiple power signal sources may allow for efficient increases in the power transmitted by the one or more coils. Additionally or alternatively, the power usage of individual power signal sources may be reduced for a given peak power. In some cases, reduced power consumption may increase safety, by reducing the heat dissipated, and may reduce the size and/or complexity of the power signal sources. In various implementations, the numbers of power signal source and transmit coils may be generalized to N power signal sources and M coils, where one or more power signal source is provided per coil. The N power signal sources may be drive synchronously. In some implementations, the N power signal sources may be able to deliver N times the power of a single power signal source for a given signal source design. In various implementations, different power signal source types may be used. For example class D, class E, parallel sources, such as those of circuitry 200, 400, and/or other power signal sources may be used.

Figure 11:
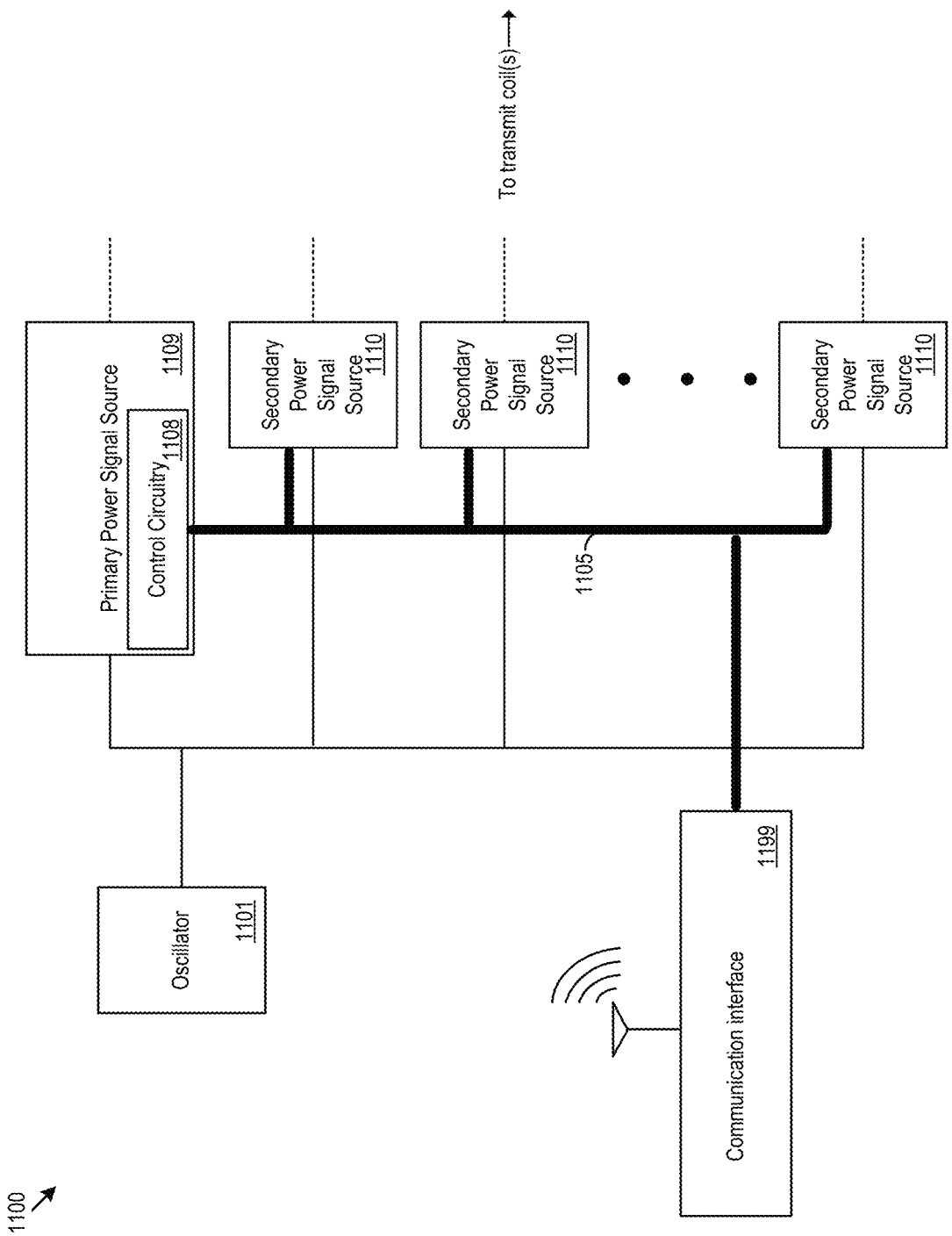
FIG. 11 shows example circuitry for synchronous control of multiple power signal sources.

FIG. 11 shows example circuitry 1100 for synchronous control of multiple power signal sources. The example circuitry may include a bus 1105 between the secondary power signal sources 1110 and a primary power signal source 1109. An oscillator 1101 may provide a common clock signal to the power signal sources 1110, 1109. A control circuitry 1108 in the primary power signal source 1109 may receive phase information, current information, load information, and/or other information from the secondary signal sources 1110 over the bus 1105. The control circuitry 1108 may transmit control information over the bus 1105 to the secondary signal sources 1110 to adjust their phase relationships. Additionally or alternatively, the control circuitry 1108 may activate and deactivate the power signal sources 1110, 1109. For example, power signal sources 1110, 1109 may be activated or deactivated depending on their respective loads. The power signal sources 1110, 1109 may include sensors to collect phase information. For example, the power signal sources may include phase sensors to collect phase information. In various implementations, the secondary power signal source may collect phase information at the inputs of their respective coils. Additionally or alternatively, in implementations where multiple power signal sources drive a single coil, the power signals sources 1110, 1109 may collect phase information at the input to the matching network of the coil. In various implementations, phase information may be collected at the input of the match network of a coil and the input to the coil for the power signal sources 1110, 1109. Collection of phase information at both the input and output of one or more matching networks may allow for current measurements in addition phase measurements. Current and phase information may be sent to the control circuitry 1108.

In some implementations, the circuitry 1100 may include a communication interface 1199 that may allow communication with a receiving device. For example, the communication interface 1199 may communicate over Bluetooth or another wireless protocol with the receiving device. The communication interface 1199 may receive application information from the receiving device. Application information may include receiving coil size, orientation information (such as accelerometer measurements and/or other orientation information), power consumption information, current demands, requests for transmitted power level adjustments, indications of charging status, and/or other application information. The communication interface 1199 may transmit the application information to the control circuitry 1108.

In some implementations, the control circuitry 1108 may implement foreign object detection based on load. For example, one or more power signal sources 1110, 1109 may be switched on or off based on a change in the load of a transmit coil. For example, the one or more power signal source associated with transmit coil may be switched of in response to a change in the load of the transmit coil when no information is received over the communication interface identifying the source of the change in the load. This may protect foreign objects from being exposed to transmitted power signals. Additionally or alternatively, some coils may remain active while others are switched off. The powering down of the coils may be localized to those with load changes reducing potential interruption to device charging and/or other transmit processes.

Figure 12:
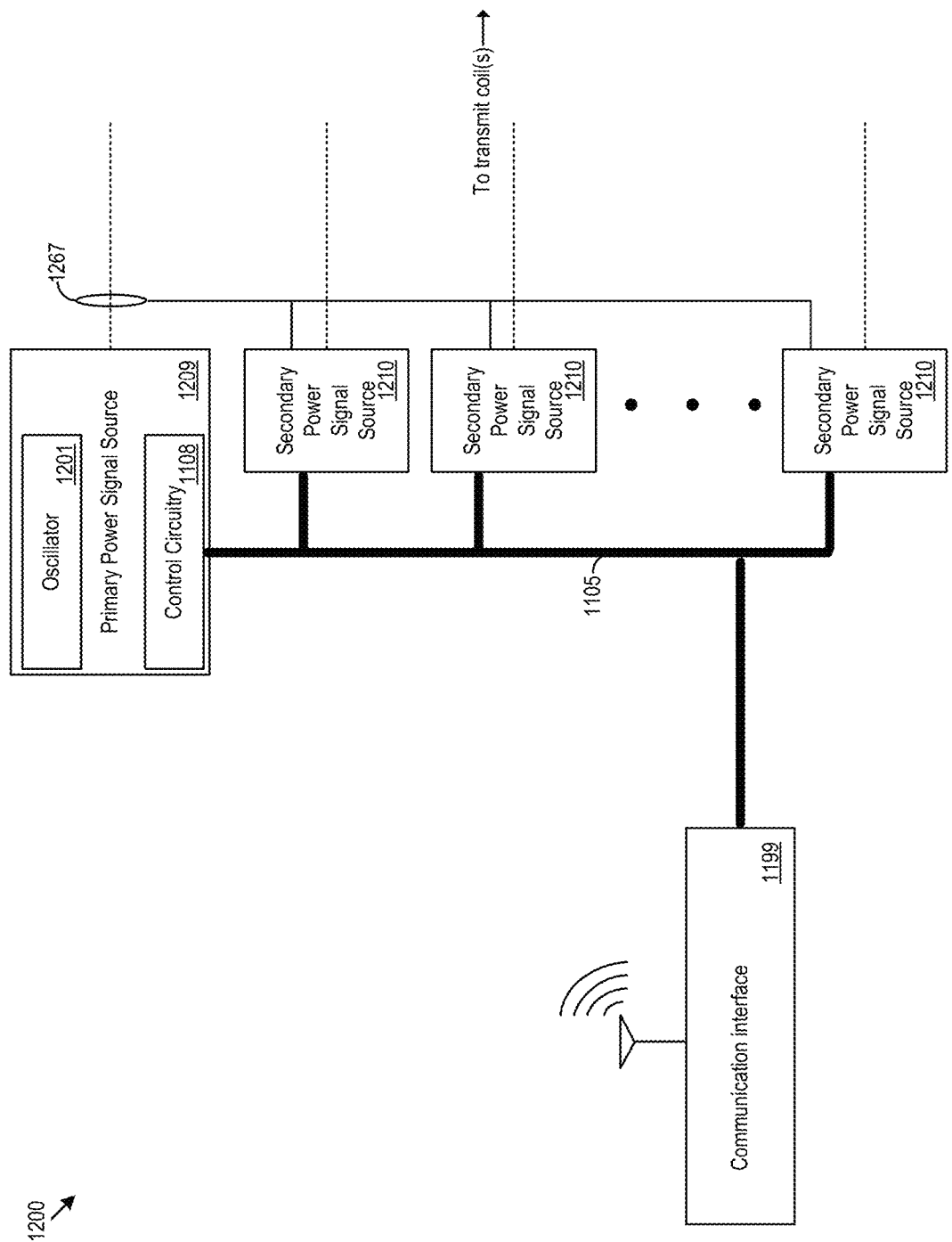
FIG. 12 shows example circuitry for synchronous control of multiple power signal sources.

FIG. 12 shows example circuitry 1200 for synchronous control of multiple power signal sources. In the example circuitry 1200, the oscillator 1201 may be combined with the primary power signal source 1209. The secondary power signal sources 1210 may receive their common clock signals from a sensor 1267 that recovers the clock signal from the output of the primary power signal source 1209.

Figure 13:
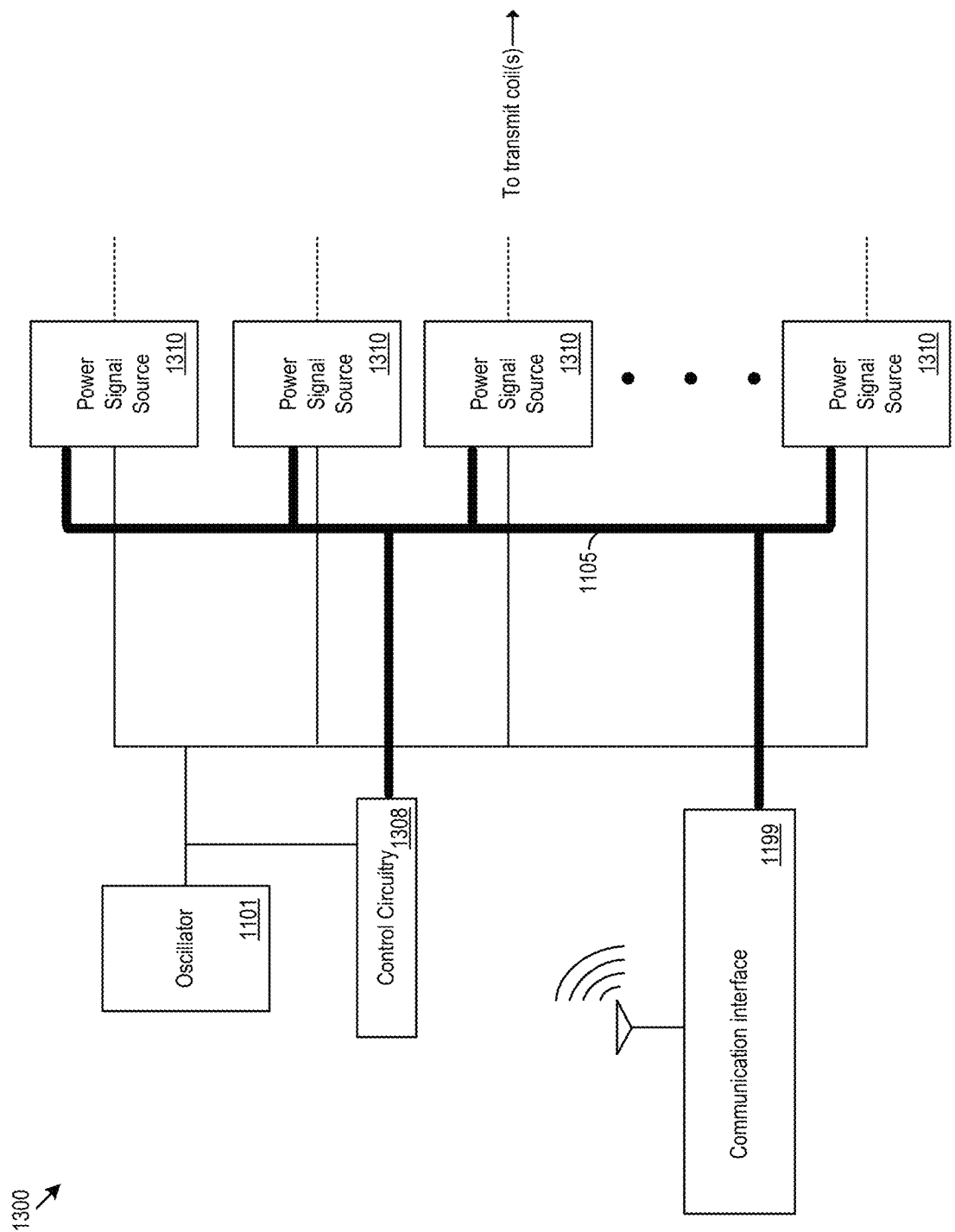
FIG. 13 shows example circuitry for synchronous control of multiple power signal sources.

FIG. 13 shows example circuitry 1300 for synchronous control of multiple power signal sources. In the example circuitry 1300, the control circuitry 1308 may be separated from the power signal sources 1310. The control circuitry 1308 may receive information from the power signal sources over the bus 1105 and may transmit control information to the power signal sources 1310. The power signal sources 1310 need not include primary and/or secondary designations.

Figure 14:
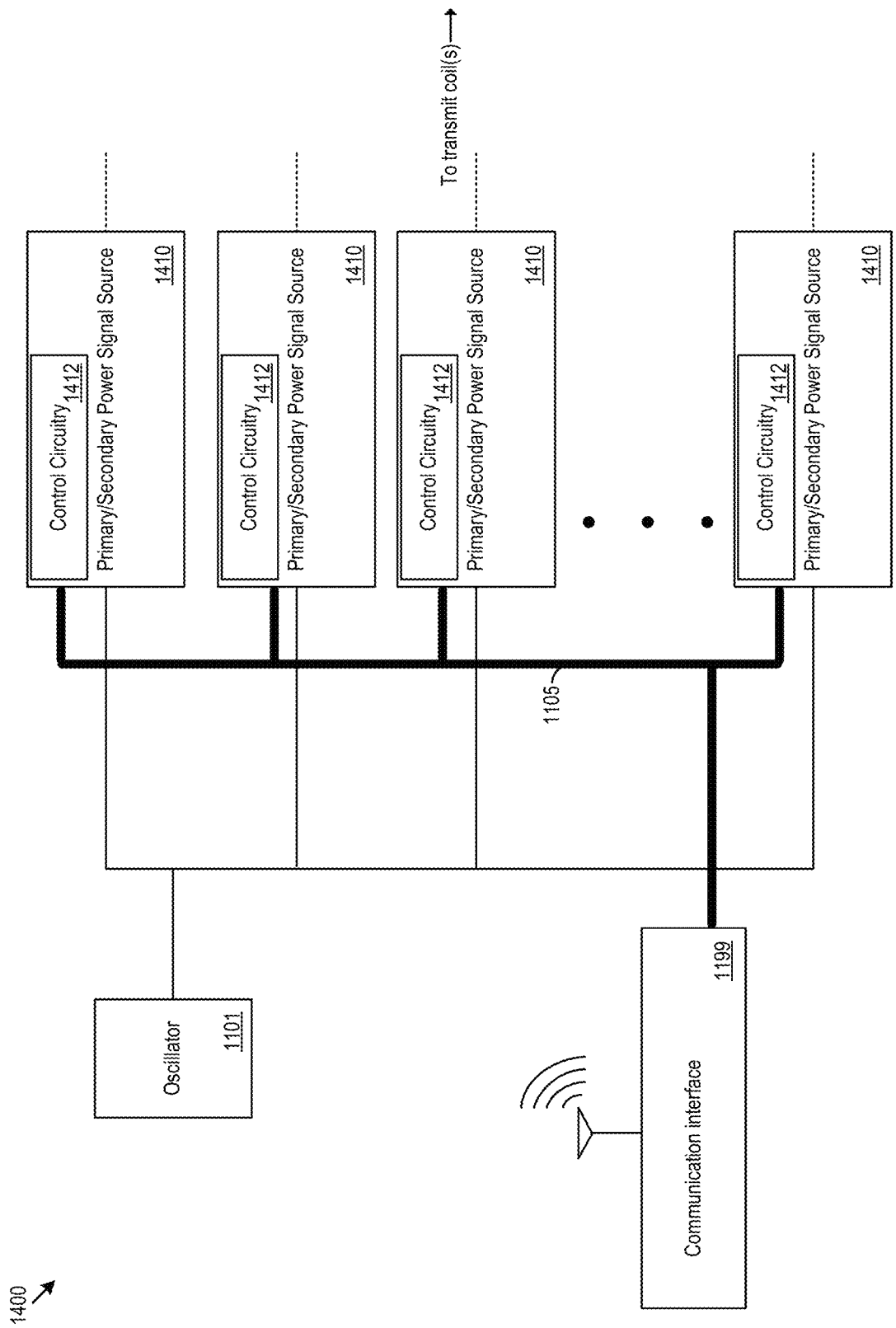
FIG. 14 shows example circuitry for synchronous control of multiple power signal sources.

FIG. 14 shows example circuitry 1400 for synchronous control of multiple power signal sources. In the example circuitry 1400, the primary/secondary power signal sources 1410 may include control circuitry 1412. The designation of primary power signal source may be changed during operation and/or design of the circuitry 1400.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

What is claimed is:
1. A device, comprising:
a power supply input configured to provide a power supply signal;
a first path configured to receive a clock signal and the power supply signal, the first path comprising:
a first output;
a first driver configured to:
accept the clock signal and modulate the power supply signal to generate, on the first output, a first oscillating power signal based on the clock signal; and drive a first modulator configured to modulate the power supply signal, the first modulator comprising a first high-side switch and a first low-side switch;

a second path configured to receive the clock signal and the power supply signal, the second path comprising:
a second output;
a delay element configured to phase shift the clock signal by an angle to generate a shifted clock signal; and
a second driver configured to:
accept the shifted clock signal and modulate the power supply signal to generate, on the second output, a second oscillating power signal that is phase shifted by the angle with respect to the first oscillating power signal; and
drive a second modulator configured to modulate the power supply signal, the second modulator comprising a second high-side switch and a second low-side switch; and a transmission circuit coupled to the first output and second output and configured to transmit a wireless power signal based on a combination of the first and second oscillating power signals.

2. The device of claim 1, wherein the wireless power signal is characterized by an amplitude that depends on the angle.

3. The device of claim 1, wherein the delay comprises an adjustable delay.

4. The device of claim 3, further comprising adjustment logic configured to adjust the adjustable delay to change the angle and control an amplitude of the wireless power signal.

5. The device of claim 1, further comprising a signal combiner configured to form the combination.

6. The device of claim 5, further comprising a filter configured to adapt the combination.

7. The device of claim 6, wherein the filter is configured to remove harmonics from the combination.

8. The device of claim 6, wherein the filter comprises a tunable filter with an adjustable filter frequency.

9. The device of claim 8, wherein the filter comprises an inductor and a capacitor, the capacitor connected in shunt with the combiner.

10. The device of claim 9, wherein:
the transmission circuit comprises an antenna characterized by a load; and
the inductor, the capacitor, or the inductor and the capacitor are selected such that the wireless power signal is independent of the load.

11. A method, comprising:
providing a clock signal to a first path and a second path;
phase delaying the clock signal on the second path by an angle with respect to the first path;
driving a first modulator on the first path in accord with the clock signal, the first modulator comprising a first high-side switch and a first low-side switch;
modulating, via the first modulator a power supply signal on the first path to generate a first oscillating power signal;
after phase delaying the clock signal on the second path, driving a second modulator on the second path in accord with the clock signal, the second modulator comprising a second high-side switch and a second low-side switch;
modulating, via the second modulator, the power supply signal on the second path to generate a second oscillating power signal; and combining the first and second oscillating power signals to generate a wireless power signal with an amplitude dependent on the angle.

12. The method of claim 11, further comprising filtering a wireless power signal.

13. The method of claim 12, wherein filtering the wireless power signal comprises adjusting a filter frequency to attempt to match a clock frequency of the clock signal.

14. The method of claim 13, further comprising sampling the first, second, or wireless power signals or any combination of the oscillating power signals to provide feedback for the adjustment of the filter frequency.

15. The method of claim 14, wherein sampling the wireless power signal comprises determining, for the wireless power signal, a phase difference between phase at a first point prior to a capacitor and phase at a second point after the capacitor.

16. The method of claim 11, wherein providing the clock signal to the first path and the second path comprises:
receiving a common clock signal for multiple power signal sources; and
adjusting a phase delay of the common clock signal to synchronize with one or more of the multiple power signal sources.

17. A device, comprising:
a clock source configured to generate a clock signal characterized by a center frequency;
a power source configured to generate a power signal;
a first path coupled to an output of the clock source, the first path comprising:
a first driver accepting the clock signal to generate a first driving signal; and
a first pair of gates coupled to the output of the power signal, the first pair of gates accepting the first driving signal to modulate the power signal to generate a first oscillating power signal characterized by the center frequency;
a second path coupled to the output of the clock source, the second path comprising:
a delay accepting the clock signal, the delay comprising an effective propagation length so as to phase delay the clock signal by an angle to generate a delayed clock signal;
a second driver coupled to the output of the delay so as to accept the delayed clock signal to generate a second driving signal; and
a second pair of gates coupled to the output of the power signal, the second pair of gates accepting the second driving signal to modulate the power signal to generate a second oscillating power signal characterized by the center frequency and phased delayed by the angle with respect to the first oscillating power signal;
a third path coupled to the output of the first and second paths so as to combine the first and second oscillating power signal to generate a wireless power signal characterized by the center frequency and with an amplitude dependent on the angle; and
a transmission circuit accepting the wireless power signal so as to drive an antenna.

18. The device of claim 17, wherein the effective propagation length comprises a tunable effective propagation length configured to allow adjustment of the angle to control the amplitude.

19. The device of claim 1, further comprising:
a capacitor coupled the transmission circuit, the capacitor comprising:

a capacitor input; and
a capacitor output;
a first phase detector circuit coupled to the capacitor input; and
a second phase detector circuit coupled to the capacitor output.

20. The device of claim 19, further comprising control circuitry configured to:
receive a first indication of a first phase value from the first phase detector circuit;
receive a second indication of a second phase value from the second phase detector circuit; and
compare the first and second indications to determine a current flowing through the capacitor.

* * * * *